United States Patent
Jellus

(10) Patent No.: US 8,587,309 B2
(45) Date of Patent: Nov. 19, 2013

(54) PHASE-DEPENDENT MAGNETIC-RESONANCE IMAGING WITH MULTIPLE COILS

(75) Inventor: Vladimir Jellus, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 309 days.

(21) Appl. No.: 12/947,295

(22) Filed: Nov. 16, 2010

(65) Prior Publication Data

US 2012/0119737 A1 May 17, 2012

(30) Foreign Application Priority Data

Nov. 16, 2009 (DE) .......................... 10 2009 053 522

(51) Int. Cl.
*G01V 3/00* (2006.01)
*G01V 3/10* (2006.01)

(52) U.S. Cl.
USPC .............................. 324/309; 324/307; 324/318

(58) Field of Classification Search
USPC .......................... 324/300–322; 600/407–465; 382/128–131
See application file for complete search history.

(56) References Cited

U.S. PATENT DOCUMENTS

| 7,218,113 | B2* | 5/2007 | Feiweier et al. | 324/320 |
| 8,362,769 | B2* | 1/2013 | Hughes et al. | 324/307 |
| 2002/0171422 | A1* | 11/2002 | King | 324/307 |
| 2006/0049829 | A1* | 3/2006 | Takizawa et al. | 324/318 |
| 2007/0098298 | A1* | 5/2007 | Xiang | 382/276 |
| 2007/0182411 | A1 | 8/2007 | Bammer et al. | |
| 2007/0299332 | A1 | 12/2007 | Ikeda | |

OTHER PUBLICATIONS

"Combination of Signals From Array Coils Using Image-Based Estimation of Coil Sensitivity Profiles," Bydder et al., Magnetic Resonance in Medicine, vol. 47 (2002) pp. 539-548.
"Phased Array Ghost Elimination," Kellman et al., NMR in Biomedicine, vol. 19 (2006) 352-361.
"Reconstruction of Phase Image for GRAPPA based Susceptibility Weighted Imaging (SWI)," Ros et al., Proc. Intl. Soc. Mag. Reson. Med., vol. 16 (2008) p. 1265.
"A General Method for Generating Multichannel Phase Images Without Using a Body Coil," Schafer et al., ISMRM Workshop on High Field Systems and Applications, Rome, Italy (2008).

* cited by examiner

*Primary Examiner* — Melissa Koval
*Assistant Examiner* — Emily Chan
(74) *Attorney, Agent, or Firm* — Schiff Hardin LLP

(57) ABSTRACT

In a method and magnetic resonance system to determine a magnetic resonance (MR) image of an examination subject, wherein multiple coil-specific MR data sets that are acquired by multiple coils are used for the MR image. Each pixel of the MR image is determined from at least two coil-specific MR data sets of different coils (6-10), and each pixel has a pixel magnitude and a pixel phase. Multiple coil-specific base phases are determined that are respectively associated with one of the multiple coils. For each pixel multiple coil-specific pixel, magnitudes and multiple pixel phases are determined. A coil-specific pixel magnitude and a coil-specific pixel phase are respectively determined from a coil-specific MR data set of one of the multiple coils (7-10). The coil-specific pixel phases with the corresponding, coil-specific base phase, and the multiple coil-specific pixel magnitudes and the multiple coil-specific pixel phases are combined into the pixel magnitude and the pixel phase of the pixel.

12 Claims, 3 Drawing Sheets

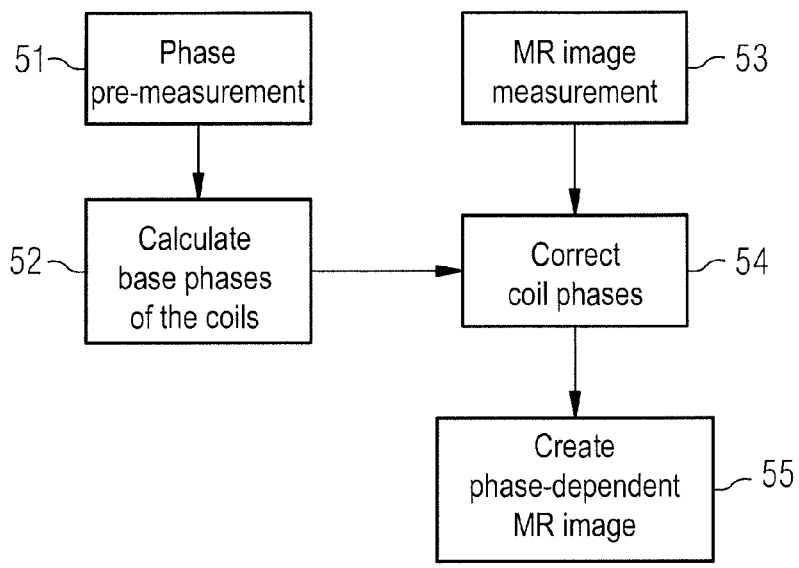
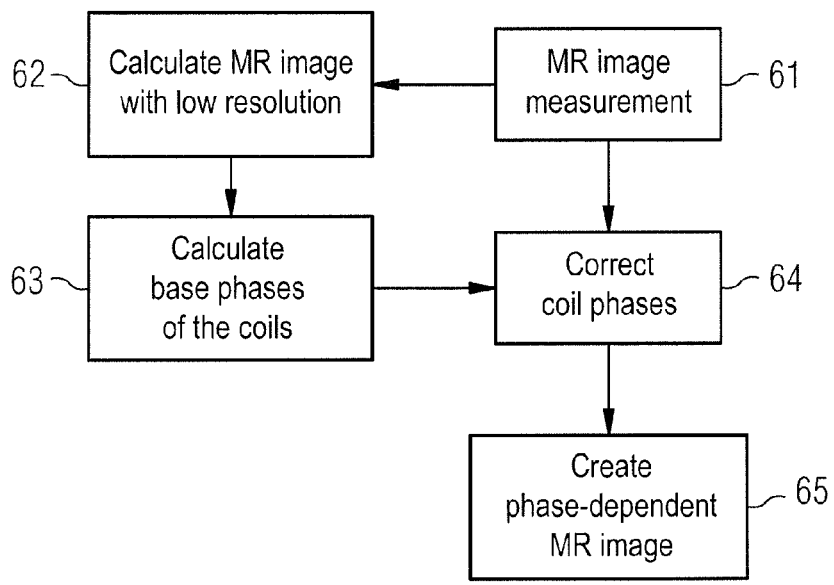

PHASE-DEPENDENT MAGNETIC-RESONANCE IMAGING WITH MULTIPLE COILS

BACKGROUND OF THE INVENTION

1. Field of the Invention

The present invention concerns a method for phase-dependent or phase-sensitive generation of a magnetic resonance image of an examination subject in which multiple coils are used to acquire magnetic resonance image data sets, and a magnetic resonance system to implement the method.

2. Description of the Prior Art

In many applications, conventional magnetic resonance imaging systems use an acquisition system with multiple coils. Different techniques are used in order to obtain a final image. For example, a quadratic summation technique—known as a "Sum of Squares" (SOS) technique—is used. This technique achieves good magnitude images if the signal-to-noise ratio (SNR) is high enough. In measurements with low signal-to-noise ratio, the result is not optimal. An additional disadvantage of this sum of squares technique is that the phase information is lost.

The phase information can be preserved if, for example, a (weighted) linear combination (LC) is used. Alternatively, a method with an adaptive coil combination—what is known as an Adaptive Coil Combine (ACC)—can handle this problem. The resulting image (which comprises phase information) is complex, and the image presentation is optimal even for images with low signal-to-noise ratio. The common problem of these two phase-dependent image generation methods (LC and ACC) is that phase singularities can occur under specific circumstances. Various special solutions in the prior art are known in order to avoid this, as described, for example, in "Reconstruction of Phase Imaging for GRAPPA based Susceptibility Weighted Imaging (SWI)" by Witoszynskyj, Herrmann and Reichenbach in Proceedings of International Society for Magnetic Resonance in Medicine, Vol. 16, Toronto, Canada, 2008, and "A General Method for Generating Multichannel Phase Images without using a Body Coil" by Schäfer and Turner for the ISMRM Workshop on High Field Systems and Applications, Rome, Italy, 15 Oct. 2008. Such methods known in the art have many limitations, however, that makes these methods generally unusable. The effects of this problem depend on the particular application. For example, artifacts with "dark points"—known as "dark point artifacts"—can occur given use of ACC in some applications.

SUMMARY OF THE INVENTION

An object of the present invention is to provide an improved general method for phase-dependent generation of magnetic resonance images that are acquired with multiple coils, in particular in an ACC for example.

According to the present invention, a method is provided to determine an MR image of an examination subject. Multiple coil-specific MR data sets that are acquired by multiple coils are used for the MR image. Each pixel (image point) of the MR image is determined from at least two coil-specific MR data sets of different coils. Each pixel has a pixel magnitude and a pixel phase. Multiple coil-specific base phases are determined in the method, and each of the multiple coil-specific base phases is associated with one of the multiple coils. For each pixel of the MR image, multiple coil-specific pixel magnitudes and multiple pixel phases are determined by the various coils. A coil-specific pixel magnitude and a coil-specific pixel phase are respectively determined from a coil-specific MR data set of one of the multiple coils. For each pixel the coil-specific pixel phases are then corrected with the corresponding, coil-specific base phase, meaning that a coil-specific pixel phase which was determined by a coil is corrected with the coil-specific base phase associated with this coil. For each pixel the multiple coil-specific pixel magnitudes and the multiple coil-specific pixel phases are then combined with the pixel magnitude and the pixel phase of the pixel.

The aforementioned phase singularities are produced by a phase offset of the signals of the individual coils due to errors or inaccuracies in receiver circuits of the corresponding coils. Because this phase offset (i.e. the base phase) is determined for each coil and because these base phases are used to correct the phase information of the individual coils, the phase information of the individual coils can be reliably corrected in a simple manner and phase singularities thus can be avoided.

According to one embodiment, the magnetic resonance image (MR image) has multiple MR image regions, with one of the multiple MR image regions is associated with each pixel of the MR image. In this embodiment, multiple coil-specific base phases are associated with each coil, these coil-specific base phases being additionally region-specific, meaning that each of these multiple coil-specific and region-specific base phases is associated with a combination of one of the multiple coils and one of the multiple MR image regions. For each pixel, the coil-specific pixel phase is corrected with the corresponding coil-specific and region-specific base phase.

Since the base phase of a coil can be different depending on the MR image region, in this embodiment multiple base phases are associated with each coil, and these multiple base phases of one coil are associated with the different image regions. This enables a more precise correction of the phase information that is provided by a coil for a pixel. Through this, phase singularities can be reliably prevented even when the base phase of a coil changes depending on the pixel location, i.e. depending on the MR image region.

According to a further embodiment, for each of the multiple coils the coil-specific base phase is determined with the aid of a pre-measurement. The pre-measurement can be of the type known as a one-shot measurement without spatial resolution, for example. In this case the signal value of a coil is an integral value of the coil properties. For example, the examination subject can be excited with a radio-frequency pulse and multiple signal values can respectively be acquired with each of the multiple coils. For example, a spin echo or a gradient echo or the FID (Free Induction Decay) signal can be acquired as the signal value. The coil-specific base phase for one of the multiple coils is respectively determined depending on the acquired signal values of the multiple coils. For example, multiple time-offset sample values can be determined as signal values of a coil.

Using the pre-measurement, the base phases of the multiple coils can be determined quickly in a simple manner.

The multiple coils can have, for example, multiple surface coils that are arranged at the examination subject. The coil-specific base phase for one of the multiple surface coils can be determined depending on the acquired signal values of the multiple surface coils with the use of an autocorrelation function. Multiple autocorrelation vectors can be determined with the aid of the autocorrelation function, in which each autocorrelation vector can be, for example, one row of the autocorrelation matrix which is formed as a result of the autocorrelation function. Each autocorrelation vector possesses an autocorrelation coefficient and an autocorrelation phase for each surface coil. The autocorrelation phases of an autocorrelation vector represent phase shifts of the individual surface coils among one another, meaning that the autocorrelation phases are independent of a phase signal of a pixel phase of the examination subject. For example, that autocorrelation vector at which the minimal autocorrelation coefficient is maximum is selected to determine the coil-specific base phase. The autocorrelation phases of the selected autocorrelation vector are associated with the coil-specific base phases. By selecting the autocorrelation vector at which the minimal autocorrelation vector is maximum it is ensured that that autocorrelation vector at which an optimally large signal deviation is present even with the small signals is selected, in particular given small signals of one or more coils.

Alternatively, that autocorrelation vector that exhibits the maximum autocorrelation coefficients is selected to determine the coil-specific base phase. The autocorrelation phases of the selected autocorrelation vector are in turn associated with coil-specific base phases. By using the autocorrelation vector with the maximum autocorrelation coefficient, the base phases are determined using the signal values which exhibit a maximum signal level and thus a good signal-to-noise ratio.

According to a further embodiment, the multiple coils include multiple surface coils and a body coil. With the use of a correlation function, the coil-specific base phase for one of the multiple surface coils is determined depending on the acquired signal values of the multiple surface coils and the acquired signal values of the body coil. For example, the correlation function can be a matrix multiplication of a matrix of the signal values of the surface coils with a vector of the values of the body coil. To determine the signal values of the surface coils and the body coil, two pre-measurements—for example one-shot measurements without spatial resolution—can be implemented, wherein the signal values of the body coil are determined in a first pre-measurement and the signal values of the multiple surface coils are determined simultaneously in a second pre-measurement.

The result of the correlation function yields a correlation vector that has a correlation coefficient and a correlation phase for each surface coil. The corresponding correlation phases are associated with the coil-specific base phases of the surface coils. In this embodiment a phase shift of the multiple surface coils is respectively determined with regard to the body coil which serves as a reference, so a robust method is achieved.

According to a further embodiment, for each of the multiple coils the coil-specific base phase is determined with the aid of a pre-measurement with spatial resolution. In the pre-measurement with spatial resolution, the examination subject is excited with a radio-frequency pulse and gradient fields and multiple signal values are respectively acquired with each of the multiple coils, from which signal values coil-specific pixel magnitudes and coil-specific pixel phases are determined. The coil-specific base phase for one of the multiple coils is determined depending on the determined coil-specific pixel magnitudes and coil-specific pixel phases of the multiple coils. The pre-measurement with spatial resolution can be implemented with a lower resolution relative to a final measurement to determine the MR image of the examination subject. The coil-specific pixel magnitudes and coil-specific pixel phases can be formed from the signal values, for example with the aid of a Fourier transformation.

By using a lower spatial resolution in the pre-measurement, the coil-specific pixel magnitudes and coil-specific pixel phases can be determined quickly without great computational effort. The pre-measurement with spatial resolution can be a 3D measurement, for example, so a short acquisition time is achieved for the pre-measurement. Spatially dependent phase shifts can be determined with the aid of the pre-measurement with spatial resolution, which is advantageous given a spatially dependent fluctuation of the base phase of a coil since this spatial dependency can be taken into account in the form of coil-dependent and spatially dependent base phases.

The multiple coils can be multiple surface coils and a body coil. With the use of a correlation function, the coil-specific base phase for one of the multiple surface coils can be determined depending on the determined coil-specific pixel magnitudes and coil-specific pixel phases of the multiple surface coils and the coil-specific pixel magnitudes and coil-specific pixel phases of the body coil. The correlation function can comprise a matrix multiplication in which a matrix of the coil-specific pixel magnitudes and coil-specific pixel phases of the multiple surface coils is multiplied with a vector of the coil-specific pixel magnitudes and coil-specific pixel phases of the body coil. The result of the matrix multiplication is a correlation vector which possesses correlation coefficients and correlation phases for each of the multiple surface coils. The correlation phases are correspondingly associated with the coil-specific base phases.

According to a further embodiment, the multiple coils comprise multiple surface coils. For each of the multiple surface coils, the coil-specific base phase is determined with the use of the multiple coil-specific pixel magnitudes and coil-specific pixel phases that are determined for each pixel. The coil-specific base phase for one of the multiple surface coils is determined depending on the determined coil-specific pixel magnitudes and coil-specific pixel phases with the use of an autocorrelation function.

The coil-specific pixel magnitudes and coil-specific pixel phases can be determined with the aid of a magnetic resonance measurement with spatial resolution. A subset of the determined coil-specific pixel magnitudes and coil-specific pixel phases can be used for the autocorrelation function. The result of the autocorrelation function can be an autocorrelation matrix with multiple autocorrelation vectors, each autocorrelation vector for each surface coil having an autocorrelation coefficient and an autocorrelation phase. To determine the coil-specific base phases, that autocorrelation vector can be selected at which the minimal autocorrelation coefficient is maximum, wherein the autocorrelation phases of the selected autocorrelation vector are associated with the coil-specific base phases. Alternatively, that autocorrelation vector can be selected which exhibits the maximum autocorrelation coefficient, wherein the autocorrelation phases of the selected autocorrelation vector are associated with the coil-specific base phases. The first case can be used given low signals since here a sufficient signal deviation is ensured. The second case generally ensures that that autocorrelation vector is selected at which a good signal-to-noise ratio is present.

According to the present invention, a magnetic resonance system is also provided. The magnetic resonance system has multiple coils to generate an alternating magnetic field for nuclear magnetic resonance excitation and/or to receive the field emanating from the nuclear moment. The magnetic resonance system also has a control device to activate multiple coils and an evaluation device to determine an MR image of an examination subject. Each pixel of the MR image is determined from at least two or more coil-specific MR data sets of varying coils, wherein each pixel comprise a pixel magnitude and a pixel phase. The magnetic resonance system is designed to determine multiple coil-specific base phases, wherein each of the multiple coil-specific base phases is associated with one of the multiple coils. The magnetic resonance system is also designed to determine multiple coil-specific pixel magnitudes and multiple coil-specific pixel phases for each pixel of the image region. A coil-specific pixel magnitude and a coil-specific pixel phase are respectively determined from a corresponding coil-specific MR data set. The coil-specific pixel phases are corrected with the corresponding coil-specific base phases, and the multiple coil-specific pixel magnitudes and the multiple corrected, coil-specific pixel phases are combined into the pixel magnitude and the pixel phase of the pixel. The magnetic resonance system designed in such a manner is designed to implement the method described above and its embodiments and thus comprises the advantages described above.

The present invention also encompasses a non-transitory computer-readable storage medium that is encoded with programming instructions that cause a computerized control system of a magnetic resonance system, into which the medium is loaded, to execute the method described above, as well as all embodiments thereof.

BRIEF DESCRIPTION OF THE DRAWINGS

FIG. 5 is a flow diagram with the steps for phase-dependent generation of an MR image according to a further embodiment.

FIG. 6 is a flow diagram with the steps for phase-dependent generation of an MR image according to yet another further embodiment.

DESCRIPTION OF THE PREFERRED EMBODIMENTS

Figure 1:
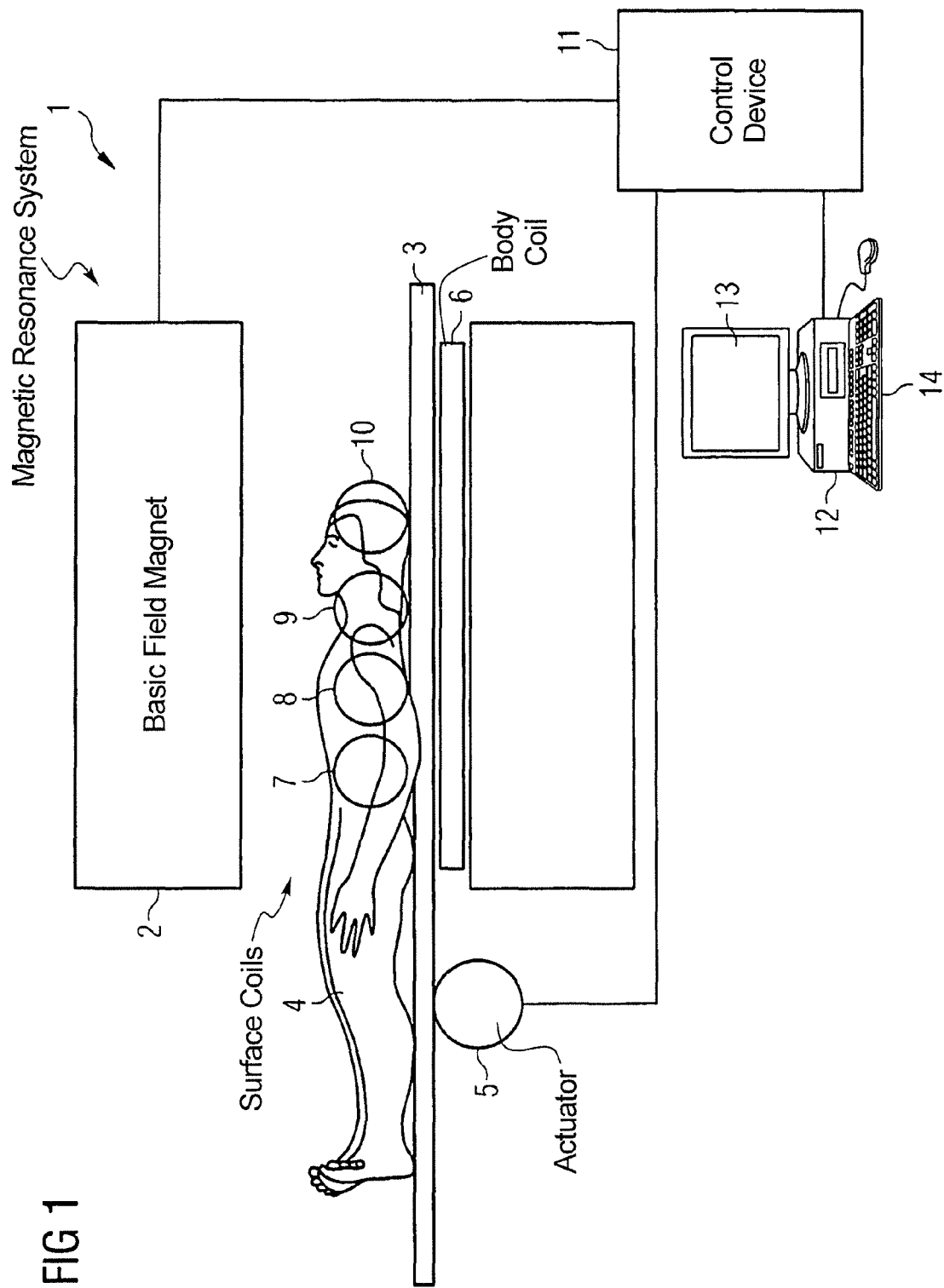
FIG. 1 schematically illustrates an MR system for phase-dependent generation of an MR image.

A magnetic resonance system 1 with which phase-dependent magnetic resonance images can be generated according to the invention is shown in FIG. 1. The MR system 1 has a basic field magnet 2 to generate a polarization field $B_0$. A patient 4 arranged on patient bed 3 is driven with the aid of an actuator 5 into the magnet 2 where the acquisition of MR data set signals from an examination region is implemented via radiation of RF pulses and shifting of gradients, for example with a body coil 6 and surface coils 7-10. How MR images can be generated in a pulse sequence via a succession of RF pulses and shifting of gradients is basically known to those skilled in the art and need not be described in detail herein. The MR system 1 is in communication with a control device 11 with which the MR system 1 is controlled. Among other things, the control device 11 possesses an RF control unit which controls the switching of the RF pulses to deflect the magnetization. An evaluation device 12 calculates MR images form the MR signals detected with the coils 6-10, for example in a known manner via a Fourier transformation, which MR images can be displayed on a display unit 13. The MR system 1 can be controlled by an operator with an operating unit 14. Further typical components of an MR system 1 have been omitted for reasons of clarity.

The magnetic resonance system 1 shown in FIG. 1 is in the position to generate magnetic resonance images using multiple coils 6-10. Multiple or all coils 6-10 can thereby contribute to the generation of each pixel of the final image. In order to generate a phase-dependent MR image, i.e. an MR image in which each pixel also possesses phase information in addition to magnitude information, a complex signal is calculated via a linear combination for every pixel (i.e. for every volume element) from the complex signal values of the various coils 6-10. Equation (1) shows such a linear combination for nCha coils.

$$S_m(x, y, z) = \sum_{k=1}^{nCHa} S_k(x, y, z) * |E_k(x, y, z)| * e^{j*\varphi_k(x,y,z)} \quad (1)$$

wherein $S_m(x,y,z)$ is the measured signal for a pixel or a volume element at the location x, y, z, $S_k(x,y,z)$ is the measured signal of the coil k at the location x, y, z, and $E_k(x,y,z)$ is the magnitude of the coil sensitivity of the coil k, and $\varphi_k(x,y,z)$ is the phase of the sensitivity of coil k due to the coil properties themselves and the downstream amplifier circuit and additional influencing factors at the location x, y, z.

A precise correction of the phases of the coils would require a pixel-based correction. This is generally not practical. Moreover, to avoid phase singularities it is sufficient to compensate a base phase for each coil, as is indicated in Equation (2).

$$S_c(x, y, z) = \sum_{k=1}^{nCHa} S_k(x, y, z) * |E_k(x, y, z)| * e^{j*\varphi_k(x,y,z)} * e^{-j*\varphi_k} \quad (2)$$

wherein $\varphi_k$ is the mean phase due to the coil k, the receiver circuit downstream of coil k and additional system properties, and $S_c(x,y,z)$ is the corrected signal for the pixel at the location x, y, z.

Three methods are subsequently described for the determination of the base phase $\varphi_k$.

1. Special Phase Pre-Measurement

Figure 2:
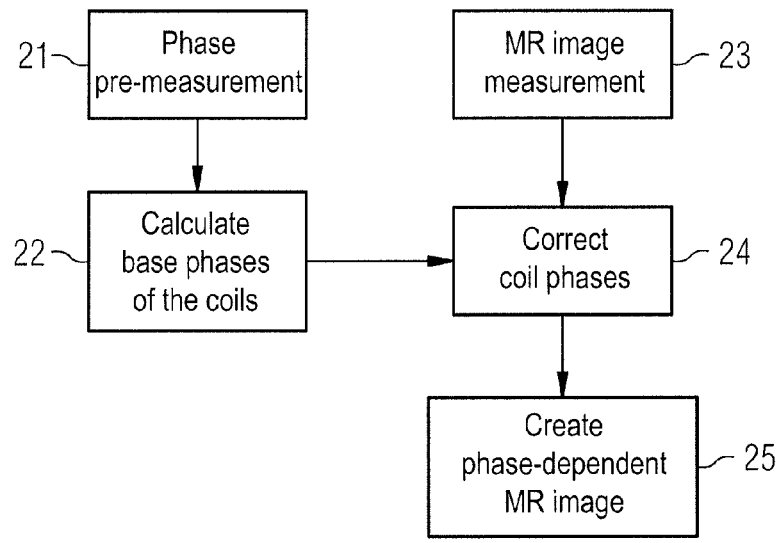
FIG. 2 is a flow diagram with the steps for phase-dependent generation of an MR image.
Figure 3:
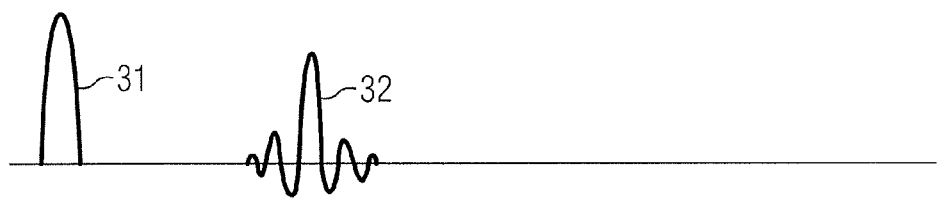
FIG. 3 shows a signal pulse curve for a pre-measurement to determine the coil-specific base phases.
Figure 4:
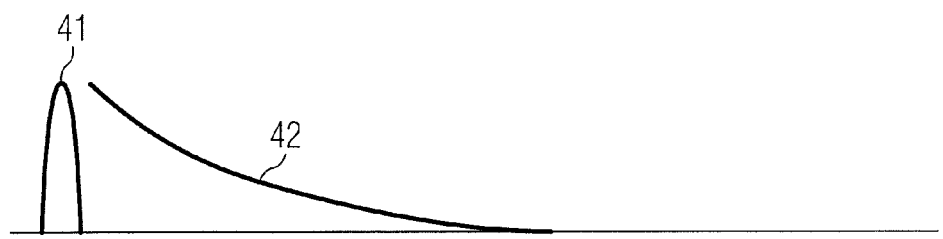
FIG. 4 shows a signal curve for a pre-measurement to determine coil-specific base phases according to a further embodiment.

The flow diagram of FIG. 2 shows the workflow of a method with a special phase pre-measurement, what is known as a phase prescan. As is shown in FIG. 2, a phase pre-measurement is implemented in block 21. This phase pre-measurement can, for example, be what is known as a one shot measurement without spatial resolution. FIGS. 3 and 4 show schematic signal workflows for such phase pre-measurements. The measurement can ensue in the form of a gradient/spin echo measurement (as shown in FIG. 3) or in the form of an FID (Free Induction Decay) measurement (as shown in FIG. 4). In FIG. 3 the examination subject 4 is excited with a radio-frequency pulse 31 and a spin echo or gradient echo signal 32 is acquired by the coils 6-10. In FIG. 4 the examination subject 4 is excited with a radio-frequency pulse 41 and an FID signal 42 is acquired by the coils 6-10.

In both cases (FIG. 3 or FIG. 4) two variants are possible, and in fact a pre-measurement with only the surface coils 7-10 or two pre-measurements, one with only the body coil 6 and an additional one with only the surface coils 7-10. If gradients are read out (advantageously in a gradient/spin echo measurement), a Fourier transformation should initially be applied.

For each surface coil 7-10 a predetermined number of signal values are determined for the further calculation. All signal values or a subset according to a predetermined criterion (for example a signal intensity) can be selected. The number of selected signal values which are used for the further calculation is subsequently designated with nSig. A matrix S according to Equation (3) (as is described in the following) is formed with the signal values of the surface coils 7-10 that are determined in such a manner. For each of the nCha surface coils 7-10 the matrix S contains nSig signal values.

$$S = \begin{bmatrix} S_{1,1} & S_{1,2} & \ldots & \ldots & \ldots & S_{1,nSig} \\ S_{2,1} & S_{2,2} & & \ldots & & S_{2,nSig} \\ S_{3,1} & S_{3,2} & & \ldots & & S_{3,nSig} \\ \ldots & & & & & \ldots \\ S_{nCha,1} & \ldots & \ldots & \ldots & \ldots & S_{nCha,nSig} \end{bmatrix} \quad (3)$$

In the event that a special phase presampling was also conducted for the body coil 6, a vector B of the signal values which were acquired for the body coil 6 is formed, as shown in Equation (4).

$$B = [b_1 \, b_2 \, \ldots \ldots \ldots \, b_{nSig}] \quad (4)$$

With the aid of the matrix S a base phase for a phase correction can be determined for each of the surface coils 7-10 using the phase shifts of the individual surface coils 7-10 among one another, in that an autocorrelation matrix is formed according to the following Equation (5) as a product of the matrix S with the transposed, conjugated complex matrix S*.

$$A = S*S^* \quad (5)$$

The autocorrelation matrix A consequently has nCha rows and nCha columns, as shown in Equation (6):

$$A = \begin{bmatrix} a_{1,1} & a_{1,2} & \ldots & \ldots & a_{1,nCha} \\ a_{2,1} & a_{2,2} & \ldots & \ldots & a_{2,nCha} \\ a_{3,1} & \ldots & & & \ldots \\ \ldots & & & & \ldots \\ a_{nCha,1} & a_{nCha,2} & \ldots & \ldots & a_{nCha,nCha} \end{bmatrix} \quad (6)$$

Every element of the autocorrelation matrix A has an autocorrelation coefficient $|a|$ and an autocorrelation phase $\phi$, as shown in Equation (7):

$$A = \begin{bmatrix} |a_{1,1}| & |a_{1,2}|^* e^{j^* \varphi_{1,2}} & \ldots & \ldots & |a_{1,nCha}| e^{*j^* \varphi_{1,nCha}} \\ |a_{2,1}|^* e^{j^* \varphi_{2,1}} & |a_{2,2}| & \ldots & \ldots & |a_{2,nCha}| e^{*j^* \varphi_{2,nCha}} \\ |a_{3,1}|^* e^{j^* \varphi_{3,1}} & & \ldots & & \ldots \\ \ldots & & & & \ldots \\ |a_{nCha,1}|^* e^{j^* \varphi nCha,1} & |a_{nCha,2}|^* e^{j^* \varphi nCha,2} & \ldots & \ldots & |a_{nCha,nCha}| \end{bmatrix} \quad (7)$$

Every row of the autocorrelation matrix A thus provides nCha autocorrelation phases $\phi$ which can be used as coil-specific base phases for the surface coils 7-10. That row (i.e. that vector) of the autocorrelation matrix at which the signal level is optimally high is advantageously used to determine the coil-specific base phases in order to determine the base phases based on signal values which exhibit an optimally high signal-to-noise. For example, the row of the autocorrelation matrix that exhibits the maximum autocorrelation coefficient $|a|$ can consequently be selected. In order to ensure that the row of the autocorrelation matrix A that comprises signal values that exhibit an optimally high signal deviation for all coils is selected, the row of the autocorrelation matrix A can alternatively be selected in which the minimal autocorrelation coefficient $|a|$ is maximum. This ensures that this row of the autocorrelation matrix A provides reliable phase information as a base phase for all surface coils 7-10.

Instead of considering the base phases of the surface coils 7-10 among one another and determining corresponding base phases, the phase shift of the surface coils 7-10 in relation to the body coil 7 can be used to determine the coil-specific base phases for the surface coils 7-10. For this purpose, a correlation matrix C is formed as a matrix product of the vector B of the signal values of the body coil 6 with the transposed, conjugated complex matrix S* of the signal values of the surface coils 7-10, as shown in Equation (8):

$$C = B*S^* \quad (8)$$

The result of the matrix multiplication is a vector C with nCha components, as shown in Equation (9):

$$C = [c_1 \, c_2 \, \ldots \ldots \, c_{nCha}] \quad (9)$$

Each component c of the correlation matrix or, respectively, the vector c has a magnitude $|c|$ and a phase $\phi$, as shown in Equation (10):

$$C = [|c_1|^* e^{j^* \phi_1} \, |c_2|^* e^{j^* \phi_2} \ldots \ldots |c_{nCha}| e^{*j^* \phi nCha}] \quad (10)$$

The phases $\phi_1$ through $\phi_{nCha}$ represent the phase shifts of the individual surface coils 7-10 in relation to the body coil 6 and thus can be used as base phases for the surface coils y-10 in Equation (2), as was previously described.

Referring to FIG. 2, the base phases $\phi$ of the surface coils 7-10 in block 22 are thus determined from the phase pre-measurement in block 21. A phase-dependent MR image measurement subsequently ensues in block 23. The contributions to each individual pixel that are determined with the aid of the coils 6-10 are corrected in block 24 with the aid of the base phases $\phi$ and combined into an MR image (block 25), as is described in connection with Equation (2). As an alternative to this linear combination (LC) of Equation (2), a different phase-sensitive image reconstruction can also be used, for example an Adaptive Coil Combine (ACC). Phase singularities and dark point artifacts can be reliably avoided via the phase correction.

2. Use of Normalization Information of a Pre-Measurement

In connection with FIG. 5, an additional method is described for the determination of the base phases and to determine a phase-dependent MR image. For example, a 3D pre-measurement—what is known as a 3D prescan—is used which was already implemented for other purposes, for example for a normalization.

A pre-measurement with spatial resolution is implemented in block 51, for example with the aid of a 3D measurement (what is known as a 3D scan). The result of this pre-measurement is three-dimensional images, respectively of the surface coils 7-10 and the body coil 6. To form the signal matrices according to Equations (3) and (4), signal values can be selected from the pre-measurement in the following ways.

all points or measurement values of the 3D measurement are selected with the same correction for all measured slices of the 3D volume, or
  points from the 3D measurement are selected which are interpolated for a position of a selected slice, whereby a slice-specific correction is achieved.

In both cases either all points of the 3D volume or the slice can be used, or only a few points according to a predetermined criterion can be used (for example points with a signal intensity above a predetermined threshold), or only points from a central region can be used.

The Equations (3), (4), (8), (9) and (10) described in the preceding are then used for the calculation of the coil-specific base phases. The base phases ϕ of the coils 7-10 are thus determined in block 52 from the pre-measurement of the block 51.

A spatially resolved MR image measurement with a higher resolution which is suitable for the final MR image is subsequently implemented (block 53). As is described in connection with Equation (2), each of the coils 6-10 delivers a contribution to the MR image. The contributions respectively comprise magnitude and phase information. The phase information is corrected in block 54 with the aid of the base phases ϕ of the coils 7-10. A final, phase-dependent MR image is generated in block 55 from the contributions of the coils 6-10 with the use of the corrected phase information, as described in connection with Equation (2). As an alternative to this linear combination (LC) of Equation (2), a different phase-sensitive image reconstruction can also be used, for example an Adaptive Coil Combine (ACC). Phase singularities and dark point artifacts can be reliably avoided through the phase correction.

3. Correction Based on the Image Information

A third method to determine the base phases ϕ of the surface coils 7-10 is subsequently described in connection with FIG. 6. In the third method the base phases ϕ of the surface coils 7-10 are calculated from the image signal itself. The image is advantageously initially calculated with a lower resolution in order to determine the base phases. However, the image can also be used in its full resolution. As shown in FIG. 6, the MR image measurement is initially implemented in block 61. From this an MR image with lower resolution is determined in block 62. nSig signal values are respectively selected for each of the surface coils 7-10 from the MR image with lower resolution. For example, signal values with a signal intensity over a predetermined threshold or signal values of points from a middle region of the image can be selected. Moreover, however, all signal values from all pixels of the MR image with lower resolution (which was determined in block 62) can also be used.

A matrix S according to Equation (3) is formed with the nSig signal values. In block 63 a base phase ϕ is then respectively determined for each of the surface coils 7-10 according to Equations (5) through (7), as is described in connection with the special phase prescanning. In block 64 the phase information of the signal values of the surface coils 7-10 are corrected with the corresponding base phases and in block 65 a phase-dependent MR image is created as has been explained in connection with Equation (2). As an alternative to this linear combination (LC) of Equation (2), a different phase-sensitive image reconstruction can also be used, for example an Adaptive Coil Combine (ACC). Phase singularities and dark point artifacts can be reliably avoided via the phase correction.

In the methods described above, a base phase ϕ was respectively determined for each of the surface coils 7-10 that were used to correct the phase information for all pixels of the MR image. However, depending on the application it can occur that the base phase ϕ fluctuates severely depending on the location of the pixels. In this case it is advantageous to determine and use multiple location-dependent or region-dependent base phases to correct the phase information of the surface coils 7-10. Since the base phase ϕ generally changes locally only slightly, in this case only a few MR image region-dependent base phases are also to be determined per surface coil 7-10 and accordingly are to be used in the correction of pixels of the corresponding MR image regions.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance (MR) image of an examination subject, comprising the steps of:

providing an image reconstruction computer with a plurality of coil-specific MR data sets respectively acquired by different coils, among a plurality of reception coils, in a magnetic resonance data acquisition unit;

in said computer, automatically determining a plurality of respective coil-specific base phases respectively of the different coils, each coil-specific base phase being respectively associated with one of said coils in said plurality of reception coils;

in said computer, reconstructing an MR image of the examination subject that comprises a plurality of pixels each determined from at least two of said coil-specific MR data sets;

in said computer, for each pixel, automatically determining multiple coil-specific pixel magnitudes and multiple pixel phases, with each coil-specific pixel magnitude and each coil-specific pixel phase being determined from one of the coil-specific MR data sets used to determine that pixel;

in said computer, for each pixel, correcting the multiple coil-specific pixel phases with the coil-specific base phase associated with the respective coil-specific base phase;

in said computer, for each pixel, combining the multiple coil-specific pixel magnitudes and the multiple coil-specific pixel phases to form a single pixel magnitude and a single pixel phase for each pixel; and reconstructing said MR image of the examination subject using the respective single pixel magnitudes and the respective single pixel phases of the pixels, and making the reconstructed MR image available as an electronic signal at an output of the computer.

2. A method as claimed in claim 1 wherein said MR image comprises a plurality of MR image regions, and wherein each of said pixels is associated with one of said plurality of MR image regions, and comprising:

also determining a plurality of region-specific base phases respectively for each of said coils and each of said MR image regions; and for each pixel, correcting the coil-specific pixel phase with both said corresponding coil-specific base phase and the region-specific base phase for the MR image region in which that pixel is located.

3. A method as claimed in claim 1 comprising determining said coil-specific base phase by acquiring pre-measurement data in said data acquisition unit by exciting nuclear spins in the examination subject with a radio-frequency pulse and acquiring multiple signal values respectively with each of said coils, and providing said pre-measurement data to said computer and determining the coil-specific base phase for each of said multiple coils dependent on said pre-measurement data.

4. A method as claimed in claim 3 comprising employing multiple surface coils as said plurality of coils, and determining the coil-specific base phase for each of said multiple surface coils dependent on said pre-measurement data, using an autocorrelation function.

5. A method as claimed in claim 4 comprising, in said computer, determining multiple autocorrelation vectors using said autocorrelation function, each autocorrelation vector comprising an autocorrelation coefficient and an autocorrelation phase for each of said surface coils, and selecting the autocorrelation vector at which a minimal autocorrelation coefficient is the maximum in order to determine the coil-specific base phase and respectively associating the autocorrelation phases of the selected autocorrelation vector with the coil-specific base phases.

6. A method as claimed in claim 4 comprising, in said computer, determining multiple autocorrelation vectors using said autocorrelation function, each autocorrelation vector comprising an autocorrelation coefficient and an autocorrelation phase for each of said surface coils, and selecting the autocorrelation vector at which having a maximum autocorrelation coefficient in order to determine the coil-specific base phase and respectively associating the autocorrelation phases of the selected autocorrelation vector with the coil-specific base phases.

7. A method as claimed in claim 3 comprising employing multiple surface coils and a body coil as said reception coils, and determining the coil-specific base phase for one of said surface coils using a correlation function dependent on signal values acquired from the multiple surface coils and signal values acquired by said body coil.

8. A method as claimed in claim 1 comprising determining said coil-specific base phase by acquiring spatially resolved pre-measurement data in said data acquisition unit by exciting nuclear spins in the examination subject with a radio-frequency pulse and acquiring multiple signal values respectively with each of said coils, and providing said spatially resolved pre-measurement data to said computer and determining the coil-specific base phase for each of said multiple coils dependent on said spatially resolved pre-measurement data.

9. A method as claimed in claim 8 comprising employing multiple surface coils and a body coil as said reception coils, and determining the coil-specific base phase for each of said surface coils using a correlation function, dependent on the determined coil-specific pixel magnitudes and coil-specific pixel phases of the multiple surface coils and the coil-specific pixel phases of the body coil.

10. A method as claimed in claim 1 comprising employing multiple surface coils as said reception coils, and determining the coil-specific base phase for each of said surface coils using multiple coil-specific pixel magnitudes and coil-specific pixel phases for each pixel, and using an autocorrelation function to determine the coil-specific base phase for each of said surface coils dependent on the determined coil-specific pixel magnitudes and coil-specific pixel phases.

11. A magnetic resonance imaging system comprising:
a magnetic resonance data acquisition unit comprising a plurality of RF reception coils;
an image reconstruction computer provided with a plurality of coil-specific MR data sets respectively acquired by different coils, among said plurality of RF reception coils, in said magnetic resonance data acquisition unit;
said computer being configured to automatically determine a plurality of respective coil-specific base phases respectively of the different coils, each coil-specific base phase being respectively associated with one of said coils in said plurality of reception coils;
said computer being configured to reconstruct an MR image of the examination subject that comprises a plurality of pixels each determined from at least two of said coil-specific MR data sets;
said computer, for each pixel, being configured to automatically determine multiple coil-specific pixel magnitudes and multiple pixel phases, with each coil-specific pixel magnitude and each coil-specific pixel phase being determined from one of the coil-specific MR data sets used to determine that pixel;
said computer, for each pixel, being configured to correct the multiple coil-specific pixel phases with the coil-specific base phase associated with the respective coil-specific base phase;
said computer, for each pixel, being configured to combine the multiple coil-specific pixel magnitudes and the multiple coil-specific pixel phases to form a single pixel magnitude and a single pixel phase for each pixel; and
reconstructing said MR image of the examination subject using the respective single pixel magnitudes and the respective single pixel phases of the pixels, and making the reconstructed MR image available as an electronic signal at an output of the computer.

12. A non-transitory computer-readable storage medium encoded with programming instructions, said medium being loaded into a computerized control and evaluation system of a magnetic resonance imaging system, and said programming instructions causing said computerized control and evaluation system to:
receive a plurality of coil-specific MR data sets respectively acquired by different coils, among a plurality of reception coils, in said magnetic resonance system;
determine a plurality of respective coil-specific base phases respectively of the different coils, each coil-specific base phase being respectively associated with one of said coils in said plurality of reception coils;
reconstruct an MR image of the examination subject that comprises a plurality of pixels each determined from at least two of said coil-specific MR data sets;
for each pixel, determine multiple coil-specific pixel magnitudes and multiple pixel phases, with each coil-specific pixel magnitude and each coil-specific pixel phase being determined from one of the coil-specific MR data sets used to determine that pixel;
for each pixel, correct the multiple coil-specific pixel phases with the coil-specific base phase associated with the respective coil-specific base phase;
for each pixel, combine the multiple coil-specific pixel magnitudes and the multiple coil-specific pixel phases to form a single pixel magnitude and a single pixel phase for each pixel; and
reconstruct said MR image of the examination subject using the respective single pixel magnitudes and the respective single pixel phases of the pixels, and make the reconstructed MR image available as an electronic signal at an output of the computer.

\* \* \* \* \*